United States Patent [19]

Habersetzer et al.

[11] Patent Number: 5,721,703
[45] Date of Patent: Feb. 24, 1998

[54] REPROGRAMMABLE OPTION SELECT CIRCUIT

[75] Inventors: Daryl L. Habersetzer, Boise; Casey R. Kurth, Eagle; Patrick J. Mullarkey, Meridian, all of Id.

[73] Assignee: Micron Technology, Inc., Boise, Id.

[21] Appl. No.: 641,114

[22] Filed: Apr. 29, 1996

[51] Int. Cl.[6] .................................. G11C 16/06
[52] U.S. Cl. ..................... 365/185.23; 365/185.17; 365/185.18; 365/201
[58] Field of Search ..................... 365/185.23, 185.17, 365/125.18, 201

[56] References Cited

U.S. PATENT DOCUMENTS

| 5,077,691 | 12/1991 | Haddad et al. | 365/185.23 |
| 5,324,998 | 6/1994 | Powell | 365/185.17 |
| 5,355,338 | 10/1994 | Han | 365/200 |

OTHER PUBLICATIONS

Pashley, Richard D. and Stefan K. Lai, "Flash memories: the best of two worlds," IEEE Spectrum, Dec. 1989, pp. 3–684 to 3–687.

*Primary Examiner*—Joseph E. Clawson, Jr.
*Attorney, Agent, or Firm*—Seed and Berry LLP

[57] ABSTRACT

An integrated circuit package includes an integrated circuit device that operates in more than one operational mode. The operational mode of the integrated circuit device is controlled by a mode select input. Examples of operational modes include fast page and block modes, two- and three-latency modes, and normal and test modes. A reprogrammable mode select circuit within the integrated circuit package produces a mode control signal that drives a mode select input of the integrated circuit device. The operational mode of the integrated circuit device then corresponds to the state of the mode select signal.

1 Claim, 4 Drawing Sheets

|          | PROGRAM | NORMAL  | ERASE |
|----------|---------|---------|-------|
| PROG     | 12.0    | 4.0     | 0.0   |
| ERASE    | 0.0     | 0.0     | 12.0  |
| READ     | 6.5     | 5.0     | 0.0   |
| MODE_SEL | 0.0     | 5.0     | 5.0   |
| P_U_P    | 6.5     | 5.0/0.0 | 5.0   |
| NORMAL   | 0.0     | 5.0     | 0.0   |

REPROGRAMMABLE OPTION SELECT CIRCUIT

TECHNICAL FIELD

The present invention relates to integrated circuit devices having more than one operational mode.

BACKGROUND OF THE INVENTION

Many integrated circuits can operate in more than one operational mode. For example, integrated devices can operate in "normal" mode or in test mode, where normal mode refers to the regular or normal operation of the integrated circuit and test mode refers to a special operational mode specifically for testing purposes. Similarly, integrated circuit die can be designed to operate in different operational modes such that the same die can be used in different applications. For example, a dual purpose memory die may be capable of operating in either fast page mode or extended data out mode, depending upon how the die is packaged and connected.

In synchronous memories, the packaging and connection of the die can determine the latency of the device. For example, in one type of package, the memory may operate in two-latency mode while in a different type of package, the memory die may operate in three-latency mode.

Regardless of the type of integrated device, the operational mode is typically selected in one of three ways. In the first approach to mode selection, the integrated circuit package receives an externally supplied mode select signal. If the mode select signal is high, the device operates in the first mode. If the mode select signal is low, the device operates in the second mode.

While this approach provides flexibility in the operation of the integrated circuit package, an externally supplied mode select signal can occupy additional pads on the device. Moreover, requiring an externally supplied mode select signal can complicate connection of the integrated circuit package and may reduce interchangeability of parts. For example, where the integrated circuit device is a memory device, the memory device may not function as a replacement part in common memory modules, because common memory modules typically do not provide mode select signals.

In a second method of mode selection, the operational mode of the integrated circuit device is "hard-wired" into the part before the package is sealed. Typically, hardwiring of the selected mode employs a fuse or antifuse to selectively bias a mode select input. If the fuse or antifuse is "blown", the device operates in the first mode. If the fuse or anti fuse is unblown, the device operates in the second mode.

While this approach can eliminate the need for an externally generated mode select signal, once the mode selection is hard-wired into the device, the device is limited to a single mode of operation. Consequently, the device has less versatility of application. For example, a memory device may not be moved from one memory board to another if the requirements of the new memory board are not compatible with the selected operational mode.

A third approach to mode selection that is sometimes found in testing applications is applying a supervoltage to drive an integrated circuit device into test mode. In this approach, the supervoltage, typically exceeding 10 V, is applied to an input pin of an integrated circuit device. A supervoltage detection circuit within the integrated circuit package detects the supervoltage and switches the device into test mode for as long as the supervoltage remains.

The supervoltage approach eliminates the external signal approach's requirement of a separate pin for mode selection. However, the supervoltage approach still requires an externally generated mode select signal (the supervoltage) and requires a supervoltage detection circuit to be incorporated within the integrated circuit package. Also, the supervoltage typically requires continuous application of a supervoltage exceeding 10 V. Because supervoltages are not commonly available in typical integrated circuit applications, the device remains in the test mode only as long as the device is in the test station.

SUMMARY OF THE INVENTION

An integrated circuit package includes an integrated circuit device that operates in more than one operational mode. The operational mode of the integrated circuit is controlled by a mode select signal at a mode select input. A reprogrammable mode select circuit provides the mode select signal in one of two states to select in a first or second operational mode of the integrated circuit.

In a preferred embodiment of the invention, the mode select circuit includes a reprogrammable circuit coupled between the node select input and a supply voltage. The mode select circuit includes an electrically erasable, reprogrammable, nonvolatile cell. The reprogrammable cell is preferably a FLASH cell or other electrically erasable, programmable read-only cell and is programmable to either a first state or a second state. In the first state, the reprogrammable cell passes current, and in the second state, the reprogrammable cell blocks current.

When the reprogrammable cell is programmed to the first state, the reprogrammable cell transmits the supply voltage to the mode select input, causing the integrated circuit to operate in the first operational mode. When the reprogrammable cell is programmed to the second state, the mode select input is isolated from the supply voltage and the integrated circuit operates in the second operational mode. The operational mode of the integrated circuit is therefore determined by the programmed state of the reprogrammable cell.

In one embodiment, the mode select circuit is formed from a drive bank and a programmable leg containing the reprogrammable cell. The drive bank includes a mode select transistor, a power up transistor, and a latch circuit coupled between the supply voltage to a common node. The programmable leg includes a reference transistor and the reprogrammable cell coupled between the common node and a reference potential. The mode select transistor, power up transistor, and latch charge the common node in response to input signals. If the reprogrammable cell is programmed to an open state, the programmable leg has no effect on the node voltage and the node voltage remains high. If the reprogrammable cell is programmed to the closed state, the programmable leg forms a path between the common node and the reference potential, thereby pulling down the node voltage. The latch then provides the mode select signal to the mode select input of the integrated circuit in response to the node voltage.

To allow the reprogrammable cell to be programmed, the programmable leg includes an erase line, a programming line, and the read transistor. The erase line and read transistor selectively couple the source of the reprogrammable cell to either the reference potential or an erase voltage. The programming line provides a programming voltage that determines the programmed state of the reprogrammable cell. To program the reprogrammable cell, the source of the nonvolatile cell is grounded through the read transistor, and a programming signal of about 12 V is applied to the gate of the reprogrammable cell through the programming line. The mode select transistor is turned on to supply about 6.5 V to the drain of the reprogrammable cell. With these conditions, the reprogrammable cell is programmed to the open state.

The reprogrammable cell is erased by turning OFF the read transistor to isolate the reprogrammable cell's source from the reference potential. Then, approximately 12 V is applied to the erase line to raise the source voltage. The programming voltage is set to 0 V and the drive bank is disabled so that the drain of the reprogrammable cell is left floating. With these conditions, the reprogrammable cell is erased.

A computer system according to the invention employs the integrated circuit package containing the mode select circuit. The computer system also includes input and output devices, data storage devices and control circuitry.

DETAILED DESCRIPTION OF THE INVENTION

Figure 1:
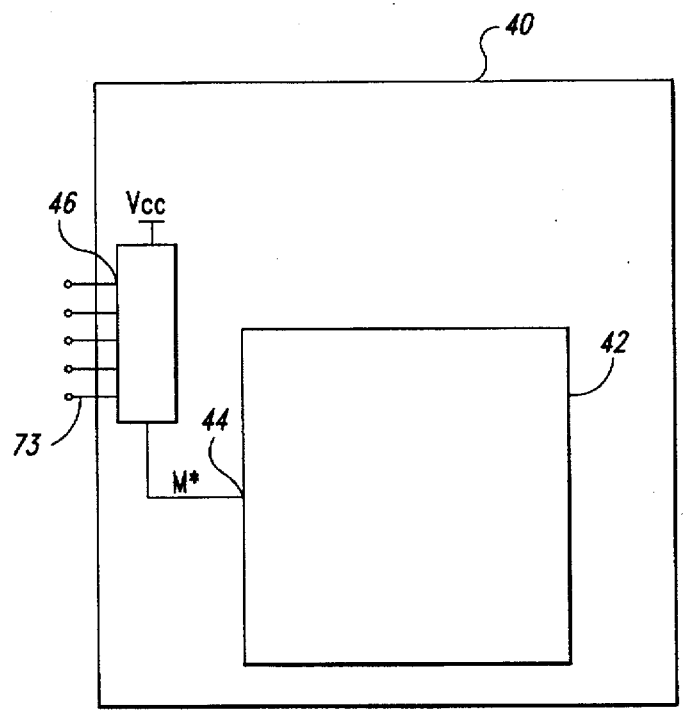
FIG. 1 is a block diagram of an integrated circuit package including an integrated circuit device and a mode select circuit.

As shown in FIG. 1, an integrated circuit package 40 contains an integrated circuit 42 that functions in more than one operational mode. The operational modes can be any distinct conventional operating modes. For example, the operational modes can be two or three-latency modes, normal or test modes, fast page or extended data out modes, enabled or disabled output modes or any other operational mode pair.

The operational mode of the integrated circuit 42 is controlled by a mode control signal M* at a control port 44. The mode control signal M* is produced within the integrated circuit package 40 in a nonvolatile, reprogrammable mode select circuit 46 that outputs the mode select signal M* in either a high or a low state, depending upon the programming of the mode select circuit 46. For example, where the integrated circuit 42 is a dual purpose die having fast page and extended data out modes, the integrated circuit 42 operates in fast page mode in response to a high mode select signal M* and operates in an extended data out mode in response to a low mode select signal M*. Similarly, where the operational modes are test and normal modes, the integrated circuit 42 operates in normal mode in response to a high mode select signal M* and operates in test mode in response to a low mode select signal M*.

Figure 2:
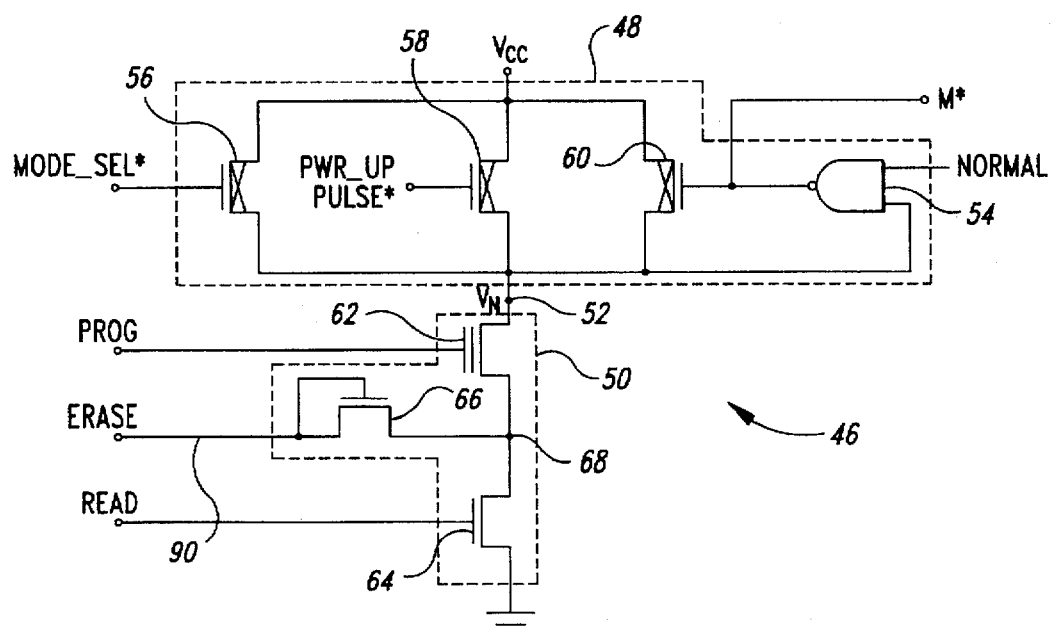
FIG. 2 is a schematic of a mode select circuit according to the invention, including an electrically reprogrammable nonvolatile cell.

FIG. 2 presents the mode select circuit 46 of FIG. 1 in greater detail. The mode select circuit 46 includes two principal portions, a drive bank 48 and a programmable leg 50. The drive bank 48 and programmable leg 50 are serially coupled between a supply voltage $V_{CC}$ and ground and are joined at a common node 52.

The drive bank 48 is formed from a NAND gate 54 and from three PMOS transistors 56, 58, 60 coupled in parallel between the supply voltage $V_{CC}$ and the common node 52. Because the transistors 56, 58, 60 are connected in parallel, if any of the transistors 56, 58, 60 is ON, the supply voltage $V_{CC}$ will reach the common node 52 and the node voltage $V_N$ will be high. If all of the transistors 56, 58, 60 are OFF, the common node 52 is isolated from the supply voltage $V_{CC}$ and the node voltage $V_N$ is determined by the programmable leg 50. Operation of the drive bank 48 will be discussed in greater detail below with respect to the signal timing diagrams of FIGS. 5A–5H.

The programmable leg 50 includes a reprogrammable, nonvolatile cell 62 and an NMOS reference transistor 64 serially coupled between the common node 52 and ground. Additionally, the programmable leg 50 includes a diode-coupled NMOS transistor 66 coupled at a reference node 68 between the reprogrammable cell 62 and the reference transistor 64.

The reprogrammable cell 62 is an electrically reprogrammable cell that, when programmed to a first state, conducts current and, when programmed to a second state, blocks current flow. The reprogrammable cell 62 may be a FLASH cell or similar electrically reprogrammable cell.

Figures 3, 4:
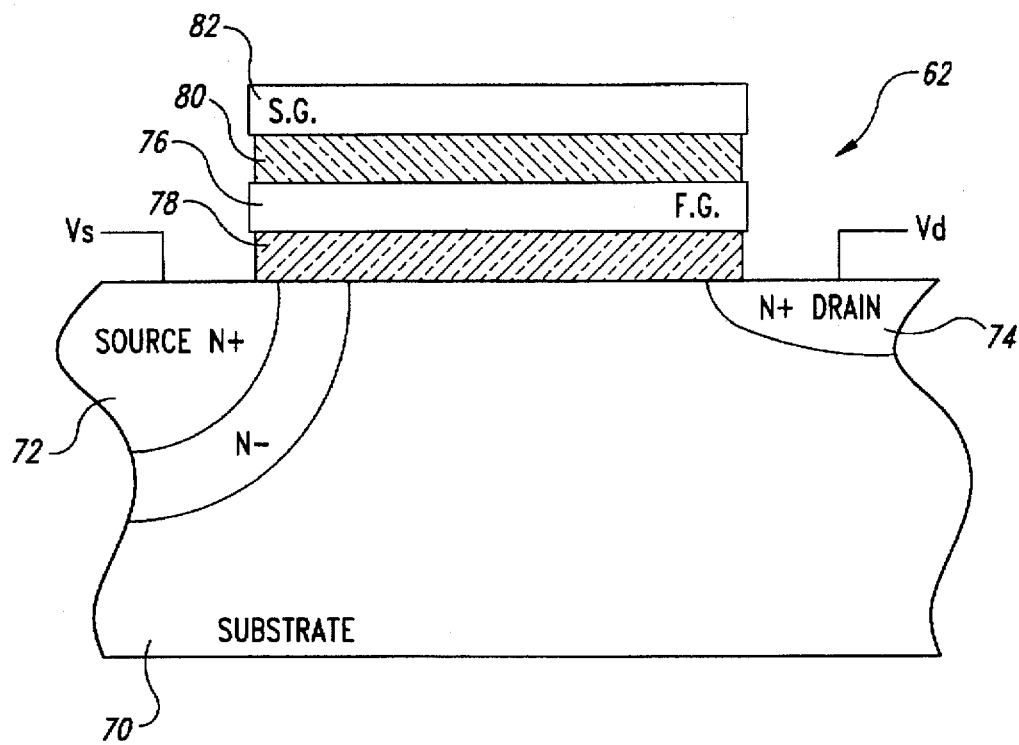
FIG. 3 is a side elevational view in cross-section of a nonvolatile reprogrammable cell formed in a p-type substrate.
FIG. 4 is a table showing selected voltages in the mode select circuit of FIG. 2 during programming, erasing and reading.

FIG. 3 shows the reprogrammable cell 62 formed in a p-type substrate 70. The reprogrammable cell 62 includes a source 72 and a drain 74 formed by respective n-wells in the substrate 70. A thin oxide layer 78 covers the substrate 70 between the source 72 and drain 74 and carries a field gate 76, electrically isolated from the substrate 70. A second thin oxide layer 80 covers the field gate 76 and carries a select gate 82, electrically isolated from the field gate 76. The reprogrammable cell 62 can be formed according to conventional FLASH device fabrication techniques.

Programming, normal operation, and erasing of the reprogrammable cell 62 are controlled by control signals READ, ERASE, PROG, NORMAL, P_U_P, and MODE_SEL produced within the integrated circuit package 40. For example, a conventional logic control section and supervoltage detection circuit of a memory device can be programmed to produce such signals. Selection of the signal set provided by the logic control section and supervoltage detection circuit is determined by an externally supplied set of signals at input terminals 73. The input terminals 73 can be spare terminals of the package 40 or can be conventional terminals activated by supervoltages. Programming the reprogrammable cell 62 will be discussed first.

Because the reprogrammable cell 62 is a FLASH cell, programming of the reprogrammable cell 62 utilizes hot-electron injection, which is a known process for programming FLASH cells. Programming is best explained with reference to FIGS. 2, 3, 4 and 5A–5H.

Figure 5:
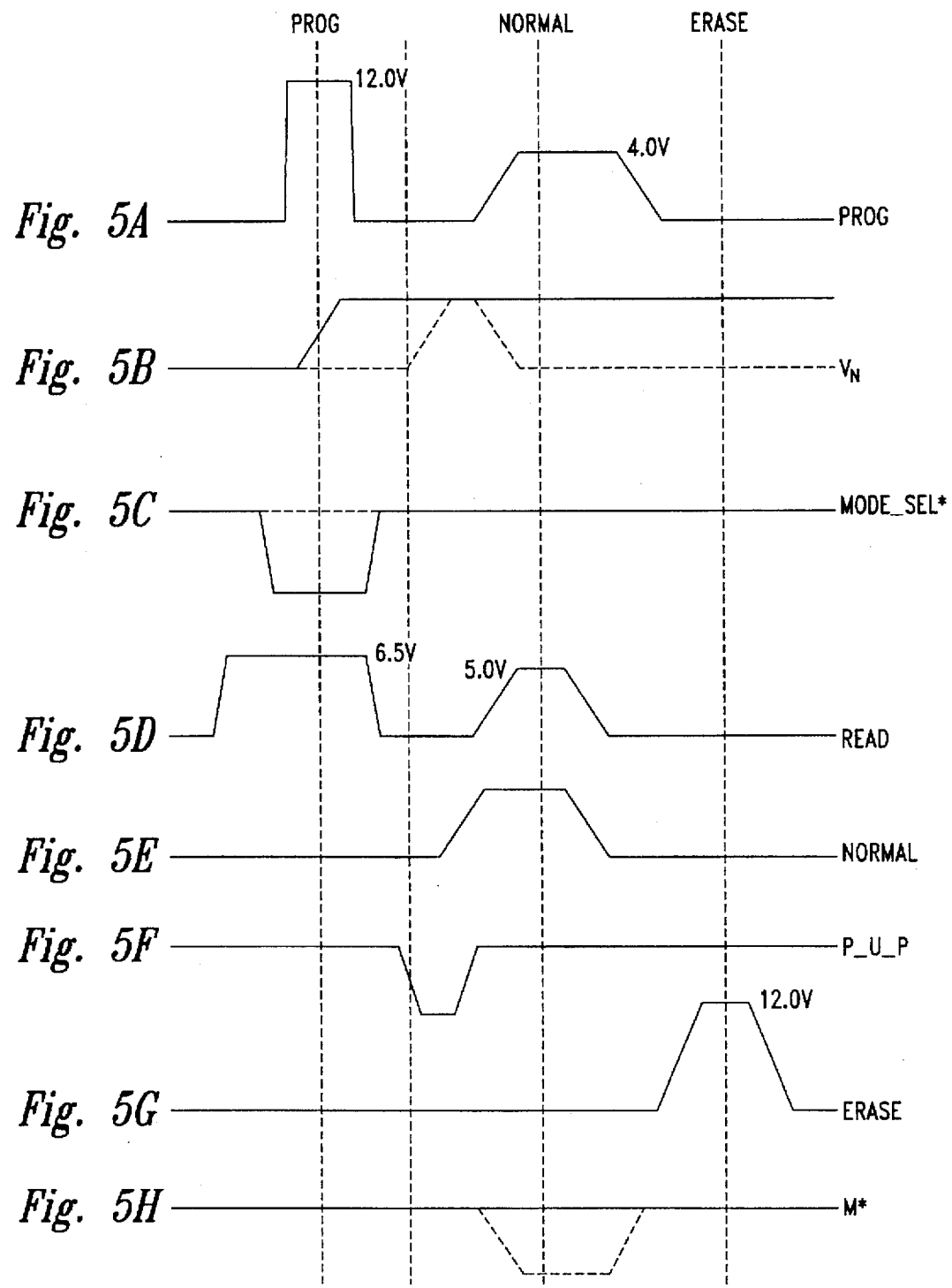
FIGS. 5A–5H are timing diagrams of various signals present in the mode select circuit of FIG. 2 during programming, detection and erasing.

First, the reference node 68 is grounded by supplying a high read signal READ of about 6.5 V to the gate of the reference transistor 64 (FIG. 5D). The read signal READ turns ON the reference transistor 64, thereby grounding the reference node 68. The source 72 of the reprogrammable cell 62 is also grounded, because it is connected to the reference node 68. At the same time, a high power up pulse signal P_U_P (FIG. 5F) turns OFF the transistor 58. A normal operation signal NORMAL (FIG. 5E) is also low to ensure that NAND gate output is high, thereby turning OFF the sense transistor 60.

Next, a programming signal PROG of about 12 V (FIG. 5A) is applied to the select gate 82 of the reprogrammable cell 62. The 12 V bias on the select gate 82 induces a voltage on the field gate 76, thereby creating a voltage differential between the field gate 76 and the channel of the reprogrammable cell 62. Simultaneously, the mode select signal MODE_SEL* goes low (FIG. 5C) to turn ON the mode select transistor 56. The mode select transistor 56 connects the common node 52 to the supply voltage $V_{CC}$. This biases the common node 52, and thus the drain 74 of the reprogrammable cell 62, to 6.5 V. With these conditions (select gate voltage =12.0 V; source voltage =0.0 V; drain voltage =6.5 V), hot-electron injection charges the field gate 76, turning OFF the reprogrammable cell 62. As is known, the reprogrammable cell 62 will remain OFF when the applied programming voltages are removed. The reprogrammable cell 62 therefore presents an open circuit between the common node 52 and the reference node 68. Once the mode select signal MODE_SEL*, the read signal READ and the programming signal PROG are removed, the node 52 is isolated. The node voltage $V_N$ remains high, because the drive bank 48 and the reprogrammable cell 62 form open circuits to trap the node voltage $V_N$.

Note that if the mode select signal MODE_SEL* is high, as represented by the broken line in FIG. 5C, the supply voltage $V_{CC}$ does not reach the common node 52 and no hot-electron injection occurs. Consequently, if the mode select signal MODE_SEL* is high, the reprogrammable cell 62 will remain closed, i.e., will connect the common node 52 to the reference node 68 and the node voltage $V_N$ will remain low as indicated by the broken lines in FIG. 5B. The mode select signal MODE-SEL* thus determines the programmed state of the reprogrammable cell 62. The integrated circuit package 40 may contain more than one mode select circuit 46 activated by respective eternally supplied mode select signals MODE_SEL* to allow selection between various mode pairs. For example, a first mode select signal MODE_SEL* can program a first mode select circuit 46 to a two-latency mode and a second mode select signal MODE_SEL* can program a second mode select circuit 46 to a block write mode.

Response of the drive bank 48 to the programmed state of the programmable leg 50 will now be described. During normal operation, the normal operation signal NORMAL is high (FIG. 5E) to enable the NAND gate 54. At the same time, the gate of the power up transistor 58 is held high by the power up pulse signal P_U_P (FIG. 5F) so that the power up transistor 58 does not couple the power supply voltage $V_{CC}$ to the common node 52. Consequently, only the programmable leg 50 and the sense transistor 60 can control the node voltage $V_N$.

During normal operation, the mode select signal MODE_SEL* is high (FIG. 5C) so that the mode select transistor 56 does not affect operation of the mode select circuit 46. The read signal READ is also high (FIG. 5D), turning ON the reference transistor 64 to couple the reference node 68 to ground. The programming signal PROG is 4 V (FIG. 5A). If the reprogrammable cell 62 is programmed to an open state, the programmable leg 50 forms an open circuit between the common node 52 and ground. If, on the other hand, the reprogrammable cell 62 is programmed to conduct current, the programmable leg 50 forms a conductive path between the common node 52 and ground. The programmed state of the reprogrammable cell 62 thus controls coupling of the common node 52 to ground.

If the reprogrammable cell 62 couples the common node 52 to ground, the node voltage $V_N$ is pulled to zero. The low node voltage $V_N$ causes a high output from the NAND gate 54 (FIG. 5H), because the node voltage $V_N$ forms one input to the NAND gate 54. The high output from the NAND gate 54 turns OFF the sense transistor 60, completely isolating the common node 52 from the supply voltage $V_{CC}$. Thus, once the node voltage $V_N$ goes low, it remains low. The low node voltage $V_N$ ensures that the output of the NAND gate 54 remains high. The NAND gate output is then used as the mode select signal M* described above with respect to FIG. 1.

If the reprogrammable cell 62 is programmed to the open state, the common node 52 is isolated from ground. Consequently, the node voltage $V_N$ can be either high or low. If the node voltage $V_N$ is high, both inputs to the NAND gate 54 are high. The NAND gate 54 then outputs a low voltage, turning ON the sense transistor 60 to couple the supply voltage $V_{CC}$ to the common node 52. Thus, if the node voltage $V_N$ is high, it will remain high. Because the normal signal NORMAL is also high, the mode select signal M* for the NAND gate 54 is low (FIG. 5H).

The power up transistor 58 establishes the proper initial conditions to prevent an indeterminate state. The indeterminate state would occur if the node voltage $V_N$ were initially low when the programmable leg 50 was programmed to an open circuit. Under these conditions, the NAND gate 54 would output a high voltage, turning OFF the sense transistor 60 and the node voltage $V_N$ would float, providing an indeterminate state. To prevent a floating node voltage $V_N$, the power up signal P_U_P pulses low briefly (FIG. 5F) when the integrated circuit 42 (FIG. 1) is activated. The brief pulse turns ON the power up transistor 58 to raise the node voltage $V_N$. The high node voltage $V_N$ causes the NAND gate 54 to turn ON the sense transistor 60 to maintain the node voltage $V_N$ at a high level. Thus, the node voltage $V_N$ a stays high when the reprogrammable cell 62 is programmed to the open state. The node voltage $V_N$ stays low when the reprogrammable cell 62 is programmed to the closed state so that the NAND gate 54 and sense transistor 60 coupled to the common node 52 therefore form an effective latch circuit. The mode select signal M* from the NAND gate 54 is thus low if the reprogrammable cell 62 is open and is high if the reprogrammable cell 62 is closed.

The above discussion describes programming and normal operation of the mode select circuit 46. However, the mode select circuit 46, unlike conventional programmable option select circuits, is reprogrammable. Reprogramming of the mode select circuit 46 will now be described.

To make reprogrammable cell 62 readily programmable to a new state, the reprogrammable cell 62 is first erased. Therefore, the mode select circuit 46 includes an erase line 90 (FIG. 2) to provide access to the source of the reprogrammable cell 62. The erase line 90 is formed from the diode-coupled NMOS transistor 66 coupled between an erase input and the reference node 68. During programming and normal operation, the erase voltage is 0 V (FIG. 5G) and the erase line 90 presents an open circuit to the reference node 68. Therefore, the erase line 90 has no effect on programming or normal operation.

During erasing, a high voltage of about 12 V (FIG. 5G) is applied to the erase input and the diode-coupled NMOS transistor 66 conducts. As shown in FIG. 5A, the programming voltage PROG is 0 V for erasing, such that the select gate 78 of the reprogrammable cell 62 is grounded. The power up pulse signal P_U_P is 5.0 V (FIG. 5F) to turn OFF the power up transistor 58. Similarly, the mode select signal MODE_SEL* is 5.0 V (FIG. 5C) to turn OFF the mode select transistor 56. The normal signal NORMAL is low (FIG. 5D) so that the NAND gate 54 outputs a high mode signal M* signal to turn OFF the sense transistor 60. Because all three transistors 56, 58, 60 are OFF, the common node 52 is isolated from the supply voltage $V_{CC}$. Consequently, the drain 74 of the reprogrammable cell 62 is left floating.

To isolate the reference node 68 from ground, the reference transistor 64 is turned OFF by grounding its gate (FIG. 5D). Then, the 12 V erase voltage ERASE is applied to the erase line 90, raising the source 72 of the reprogrammable cell 62 to 12 V. Given these conditions (drain=floating; select gate=0 V; source=12 V), electrons are removed from the field gate 76 (FIG. 3) through Fowler-Nordheim tunneling. The reprogrammable cell 62 is thereby erased and left in its closed (conducting) state.

The erasability of the reprogrammable cell 62 allows the mode select circuit 46 to be reprogrammed as desired. This reprogrammability allows modification of the selected operational mode of the integrated circuit 42 (FIG. 1). This allows greater flexibility in application of the integrated circuit package 40. For example, if the integrated circuit 42 is a multipurpose die that has been programmed to fast page mode for a specific application, the integrated circuit package 40 can be transferred to a different environment, such as a different memory board, operating in extended data out mode. As part of the transfer process, the mode select circuit 46 is reprogrammed so that the integrated circuit 42 operates in extended data out mode. Thus, the integrated circuit package 40 becomes reconfigurable for different applications.

Figure 6:
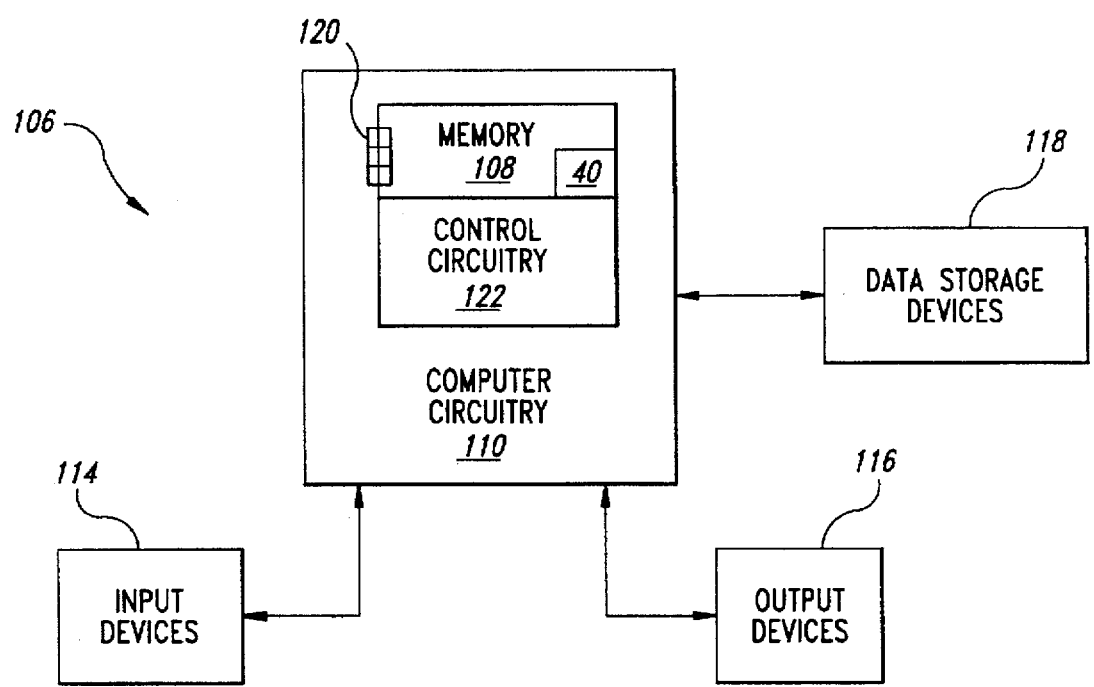
FIG. 6 is a block diagram of a computer system incorporating the integrated circuit device of FIG. 1.

FIG. 6 is a block diagram of a computer system 106 employing an integrated memory module 108 that contains the integrated circuit package 40 of FIG. 1. The computer system 106 includes computer circuitry 110 for performing computer functions, such as executing software to perform desired calculations and tasks. The computer circuitry 110 typically contains a processor (not shown) and various memory modules 108, as shown.

One or more input devices 114, such as a keypad or a mouse, are coupled to the computer circuitry 110 and allow an operator to manually input data thereto. One or more output devices 116 are coupled to the computer circuitry 110 to display or otherwise output data generated by the computer circuitry 110. Examples of output devices include a printer and a video display unit. One or more data storage devices 118 are coupled to the computer circuitry 110 to store data on or retrieve data from external storage media (not shown). Examples of storage devices 118 and storage media include drives that accept hard and floppy disks, tape cassettes, and compact-disk read-only memories. The computer circuitry 110 also includes control circuitry 122 that produces control signals for input to the memory module 108.

While a specific embodiment of the invention has been described herein for purposes of illustration, various modifications may be made without deviating from the spirit and scope of the invention. Accordingly, the invention is not limited except as by the appended claims.

We claim:

1. A reprogrammable mode select circuit within an integrated circuit package containing an integrated volatile device having a control part, the volatile device being responsive to operate in a first operational mode in response to a first mode select signal and to operate in a second operational mode in response to a second mode select signal, comprising:

a first node adapted to be coupled to a supply voltage;

a second node;

a reference node for providing a reference voltage;

a first circuit portion coupled between the second node and the reference node, the first circuit portion including an electrically erasable, reprogrammable, nonvolatile cell, the reprogrammable cell retaining the programmed state when power is removed including:
an input coupled to the reference node;
an output coupled to the second node; and a programming input adapted to receive a programming signal, the reprogrammable cell being programmable to either a first state or a second state, the reprogrammable cell in the first state coupling a selected signal from the input to the output and in the second state blocking the selected signal from the input to the output; and a second circuit portion coupled between the second node and the first node, the second circuit portion having a mode output coupled to the mode select input, the second circuit portion being responsive to supply the first mode select signal to the mode output in response to the reference potential at the second node and to provide the second mode select signal in response to the supply voltage at the second node, wherein the second circuit portion includes a latch circuit, the latch circuit including a NAND gate having one input coupled to the second node, the NAND gate further including an output coupled to the mode output.

* * * * *